United States Patent [19]

Ishizaka et al.

[11] Patent Number: 5,966,794
[45] Date of Patent: Oct. 19, 1999

[54] METHOD OF MANUFACTURING MULTIPLE-PIECE GRAPHITE CRUCIBLE

[75] Inventors: Susumu Ishizaka, Kodaira; Saburou Tanaka, Tokyo; Tadayoshi Kouno, Ebina, all of Japan

[73] Assignee: Nippon Carbon Co., Ltd., Tokyo, Japan

[21] Appl. No.: 09/099,428

[22] Filed: Jun. 18, 1998

[30] Foreign Application Priority Data

Jun. 18, 1997 [JP] Japan ...................................... 9-176568

[51] Int. Cl.⁶ ...................................................... B23P 11/00
[52] U.S. Cl. ................... 29/415; 29/416; 29/463
[58] Field of Search .............................. 29/415, 416, 463

[56] References Cited

FOREIGN PATENT DOCUMENTS

| 1117814 | 8/1989 | Japan . |
| 5-38059 | 9/1993 | Japan . |
| 2562245 | 12/1996 | Japan . |

*Primary Examiner*—David P. Bryant
*Assistant Examiner*—John Preta
*Attorney, Agent, or Firm*—Sughrue, Mion, Zinn, MacPeak & Seas, PLLC

[57] ABSTRACT

A method of manufacturing split crucible pieces of a multiple-piece crucible comprising an integral assembly of two or more split crucible pieces and having a spherical bottom inner surface. The split crucible pieces are manufactured from a work mass graphite material by mechanical processing, comprising a step of forming a blind annular groove coaxial with the work by cutting the work from an end thereof toward the other end, a step of axially splitting the work into two or more pieces, constituting eventual split crucible pieces, and a step of cutting each split crucible piece from the side thereof opposite the sector-like or polygonal profile surface side by using a spherical acutting means, thereby forming a spherical inner bottom surface.

9 Claims, 11 Drawing Sheets

METHOD OF MANUFACTURING MULTIPLE-PIECE GRAPHITE CRUCIBLE

BACKGROUND OF THE INVENTION

1. Field of the Invention

The present invention relates to a method of manufacturing split crucible pieces of a multiple-piece graphite crucible and, more particularly, in a method of manufacturing split crucible pieces of a multiple-piece graphite crucible constituted by an integral assembly of at least two split crucible pieces and has a spherical inner bottom surface, to a mechanical cutting process of forming a spherical bottom inner surface of each split crucible piece, which constitutes the spherical bottom inner surface of the multiple-piece graphite crucible.

2. Prior Art

In the field of electric communication apparatus, substrates for semiconductor devices and integrated circuits are manufactured from single crystal silicon bodies. A single crystal silicon body is usually obtained from polycrystalline silicon material by fusing the material and causing growth of single crystal of silicon on a seed crystal, which is raised from the melted silicon bath.

This method of growing single crystal silicon is called liquid phase epitaxy or liquid pase growth method, and utilizes a phenomenon that silicon single crystal is grown on a crystal piece, i.e., seed crystal, in a predetermined orientation relation thereto as the seed crystal is raised from a melted silicon bath. Such oriented overgrowth is utilized for obtaining a silicon single crystal body grown from polycrystalline silicon material.

Such a silicon single crystal body can be manufactured by various well-known methods. Among these methods, Czochalski method (CZ method) is usually used, because it permits mass production. In this method, a graphite crucible supporting a quartz crucible inserted therein, is used for melting polycrystalline silicon material.

Figure 1:
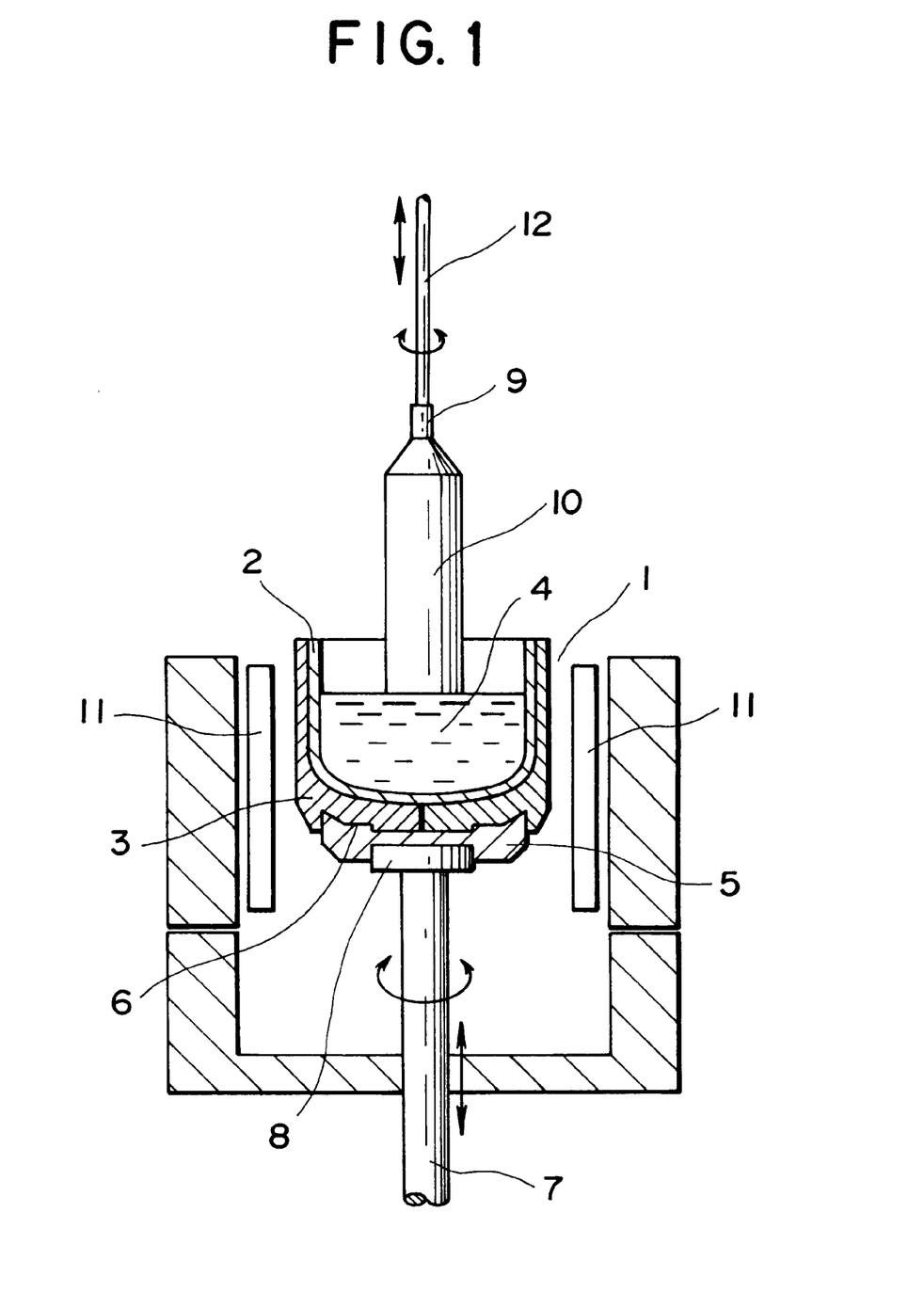
FIG. 1 is a view, partly in section, showing an example of apparatus for growing single crystal silicon by a CZ method.

FIG. 1 shows, partly in section, a conventional single crystal silicon growth apparatus based on the CZ method. Referring to the Figure, reference numeral 1 designates a crucible, in which a melted silicon bath 4 is formed by melting polycrystalline silicon material. The crucible 1 has a double-wall structure having a quartz crucible 2 and a graphite crucible 3, the former being inserted in the latter.

Graphite is material suitable for melting and other high temperature operations. However, the graphite crucible 3 cannot be directly used for melting polycrystalline silicon material, because melted silicon actively reacts with graphite. For this reason, in the application of the CZ method to the manufacture of a single crystal silicon body, the quartz crucible 2 is inserted in the graphite crucible 3, and the melted silicon bath 4 is formed in the quartz crucible 3 by putting and melting polycrystalline silicon material therein.

However, the melting temperature of the silicon material is nearly the softening temperature of quartz (around 1,550° C.). Therefore, the quartz crucible is possibly softened. In order to protect and support the quartz crucible 2 from the outer surface thereof, the graphite crucible 3 is formed such that its inner shape conforms or is complementary to the outer shape of the quartz crucible 2, so that the graphite crucible 3 protects the quartz crucible 2 inserted in it from the outer surface of the quartz crucible 2.

The graphite crucible 3 has its bottom held in engagement with an engagement member 5 which is also made of graphite. For engagement with the engagement member 5, the bottom of the graphite crucible 3 is formed with an engagement recess 6. The engagement member 5 is in turn held in engagement with an engagement piece 8, which is mounted on the upper end of a vertical shaft 7. The shaft 7 and the crucible 7 are thus made integral with each other.

The vertical shaft 7 is rotatable in the directions of arrows and also vertically movable. During single crystal silicon growth, the crucible 1 which is integral with the vertical shaft 7, is rotated and vertically moved in unison therewith, thereby maintaining a fixed head level of the melted silicon bath 4 in the quartz crucible 2.

A seed crystal 9 is dipped in the melted silicon bath with the head level held constant in the quartz crucible 2, and via the seed crystal (silicon single crystal) is grown to obtain a grown single crystal body 10.

For heating the crucible 1 and thermally melting silicon material, a heater 11, such as a graphite heat generator or a resistance heating coil, is disposed such as to surround the crucible 1.

Above the crucible 1, a raising shaft 12 is provided such that it is rotatable in the directions of arrows and vertically movable. The seed crystal 9 noted above, is detachably mounted on the lower end of the raising shaft 12. In the silicon single crystal growing operation, the seed crystal 9 mounted on the lower end of the raising shaft 12, is initially held in contact with the melted silicon bath 4 with the head level held constant in the crucible 1, i.e., the quartz crucible 2, and raised while being rotated in conformity with the growth of silicon single crystal. As a result, silicon single crystal is epitaxially grown on a particular crystal face of the seed crystal 9 in a predetermined orientation relation thereto. In this way, the single crystal body 10 is obtained as epitaxially grown silicon single crystal.

As described above, the graphite crucible 3 is used with the quartz crucible 2 inserted in it for manufacturing silicon single crystal by the CZ method. In this manufacture, it is desired that the graphite crucible 3 meets the following.

Figure 9:
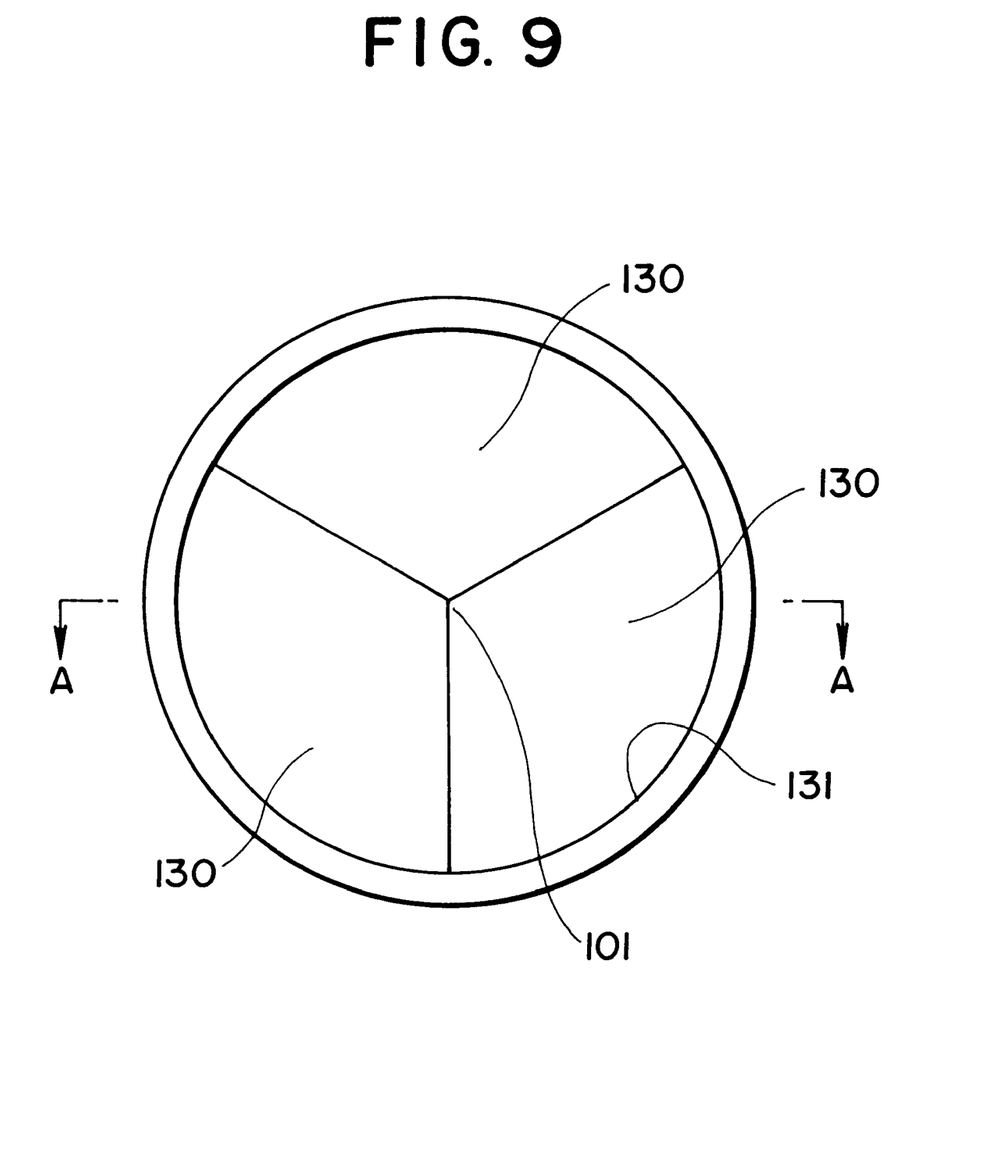
FIG. 9 is a plan view showing a graphite crucible obtained by assembling together split crucible pieces.
Figure 10:
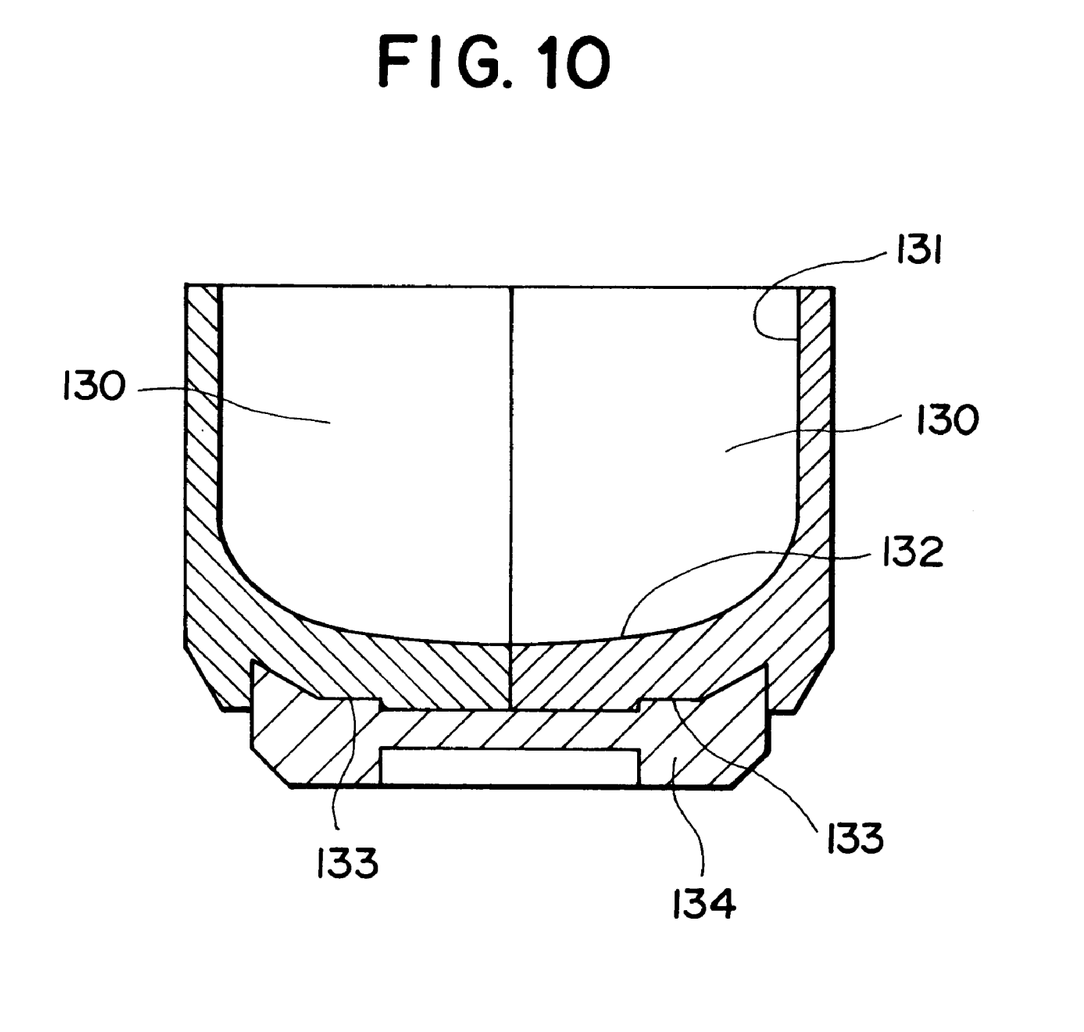
FIG. 10 is a sectional view taken along line A—A in FIG. 9.

(a) The graphite crucible 3 is not a one-piece crucible but, as shown in FIGS. 9 and 10, a multiple-piece crucible, which is an integral assembly of two or more, for instance three as in the illustrated example, split crucible pieces 130. The split crucible pieces 130 are obtained by splitting a mass graphite material in planes containing the axis of the graphite crucible obtained as their assembly. These split crucible pieces 130 usually have a sector-like cross-sectional profile as will be described later.

(b) As shown in FIG. 10, the graphite crucible which is obtained by combining the two or more split crucible pieces 130, has a spherical inner bottom surface 132, which defines a boundary zone having an arcuate cross-sectional profile between it and an inner peripheral surface 131. In other words, as shown in FIG. 9, the inner pertipheral surface 131 and the inner bottom surface 132 of the graphite crucible are continuous to each other without defining an borderline.

(c) The individual split crucible pieces 130 are produced from a cylindrical mass graphite material, which is high density isotropic graphite. Therefore, there is no adequate means for bonding together such split crucible pieces. For this reason, the split crucible pieces are produced by a mechanical cutting process. A suitable method of manufacturing the split crucible pieces without substantial material loss is thus desired.

The above requirements (a) to (c) of the graphite crucible will now be described in greater details.

The graphite crucible is not directly used for thermally melting silicon material, but it serves to protect the quartz crucible from the outer surface thereof. However, for growing silicon single crystal the graphite crucible is made integral with the quartz crucible. In the growing operation, the outer wall surfaces of the graphite crucible is exposed to silicon vapor and other gases, which enter inevitable interstices between the close contact surfaces of the graphite and quartz crucibles. Therefore, it is necessary that, not a one-piece, but a mutiple-piece graphite crucible is fabricated by assembling together two or more split crucible pieces.

This is so because of the following reasons. The quartz crucible inserted in the graphite crucible, is softened to be in close contact with the graphite crucible inner surfaces, when it is exposed to a high temperature for melting silicon material. Therefore, subsequent cooling down the crucible would cause deformation and rupture of the outer graphite crucible due to a thermal expansion coefficient difference between graphite and quartz.

In addition, during growth of single crystal silicon via the seed crystal, during which the crucible is exposed to a high temperature so that the quartz crucible is in close contact with the inner wall surfaces of the graphite crucible, an SiC layer is generated on the graphite crucible inner wall surfaces as a result of reactions given by the following formulas (1) and (2).

$$SiO_2 \text{ (quartz crucible)} + 3C \text{ (graphite crucible)} \rightarrow SiC + 2CO \quad (1)$$

$$SiO \text{ (quartz crucible)} + 2C \text{ (graphite crucible)} \rightarrow SiC + CO \quad (2)$$

The generation of SiC causes internal stress generation in the graphite crucible because of the great thermal expansion coefficient difference between SiC and graphite material.

The internal stress generated is the greater the greater the extent of SiC generation and, in the extreme case, cracks are generated in the graphite crucible.

For the above reasons, a one-piece graphite crucible cannot be used. Instead, a multiple-piece graphite crucible is fabricated by combining two or more split crucible pieces to solve the above problems with the plays between adjacent ones of the split crucible pieces assembled together.

As for the inner surface of the graphite crucible which comprises an integral assembly of two or more split crucible pieces, as shown in FIG. 9, the bottom inner surface 132 should be half-spherical or dish-like and smoothly continuous with the inner peripheral surface 131 without any borderline defined therewith.

In the conventional graphite crucible having a cylindrical inner peripheral surface, the bottom inner surface 131 and the inner peripheral surface 132 are not smoothly continuous with each other but define a borderline between them. Therefore, when the crucible is heated repeatedly, stress is concentrated in the borderline, and in its repeated use the crucible may be eventually broken around a borderline portion.

In addition, SiC formed on the graphite crucible tends to be concentrated in the borderline portion where the inner peripheral surface and the bottom inner surface are not smoothly continuous. With SiC concentration, the internal stress is also concentrated, so that the graphite crucible is often cracked in this portion.

Furthermore, by forming the bottom inner surface 132 to be spherical and smoothly continuous without defining any borderline, it is possible to make the dissolved oxygen content in the melted silicon bath 4 uniform and obtain a high quality grown single crystal body.

For the above reasons, the graphite crucible is usually fabricated such that, as shown in FIG. 9, the bottom inner surface 132 is spherical or dish-like and smoothly continuous to the inner peripheral surface 132 without defining any borderline portion.

As described before in detail, the graphite crucible used for the CZ method, should meet the requirements (a) to (c) mentioned above, that is, it should be a multiple-piece graphite crucible as an integral assembly of two or more split crucible pieces, in which the bottom inner surface is spherical and smoothly continuous without defining any borderline.

The fabrication of a graphite crucible having such a construction, however, requires a great deal of man-hour, and in the case of using a graphite material it is inevitable to have resort to a mechanical cutting means. The graphite material itself, however, is expensive. Particularly, graphite crucibles used for the CZ method or the like, are fabricated by using very expensive isotropic graphite material. In this viewpoint, a very efficient method of fabrication without substantial material loss is des i red.

In a further aspect, recent wafer size increase calls for graphite crucibles of increased sizes, which are not one-piece crucibles but multiple-piece crucibles obtained by assembling a plurality of split crucible pieces. To meet this end, many large-size mass graphite materials are provided, and small-size mass graphite materials are manufactured when they are required. However, the manufacture of mass graphite materials, particularly those of isotropic graphite, takes one half to one year. For this reason, even small-size graphite crucibles are inevitably cut out from large-size and expensive mass graphite materials.

In a still further aspect, in a standard method of graphite crucible fabrication, a large-size work mass graphite material is chucked in a chuck of a boring machine or the like, and bored along axis with a boring tool mounted on the boring machine while causing its rotation. Then the outer and inner surfaces of the work are trimmed to obtain a one-piece graphite crucible work, which is then axially split into a plurality of split crucible pieces. Sine the mass graphite material itself is large in size, the boring operation results in a great amount of cutting dust. The cutting dust is discarded, or may only be used as low price carbon material for steel manufacture.

In the boring operation, a substantial proportion of the expensive graphite material is thus lost as cutting dust. Particularly, graphite material used for the graphite crucible fabrication is isotropic graphite, and its piece is very high compared to graphite electrodes for refining metals and as high as 50 or more times the price of carbon material used for steel manufacture. The loss of a substantial proportion of such expensive graphite material is greatly reflected on the price of the graphite crucible. It is thus important in the graphite crucible fabrication to recover the removed material as high utility material.

If graphite material that is removed in the boring of a mass graphite material can be recovered as a high utility mass material (usually called cut-out material) instead of the cutting dust, it can be utilized for split crucible pieces of a graphite crucible of a reduced size, which is a revolutional economical merit.

In this connection, Japanese Laid-Open Utility Model Publication No. 1-117814 discloses a boring or cutting tool, which permits fabrication of a crucible from a mass graphite material by boring the same such that material loss as cutting dust is reduced and that a cut-out mass can be obtained.

This tool has a saw blade mounted on an end of a bar, which can be rotated by gripping its year end grip.

To bore a cylindrical mass graphite material with this tool, a concentric annular groove is preliminarily formed in the material from an end thereof toward the other end. Then, the bar of the tool is inserted into the groove until it reaches the bottom thereof. In this state, the saw blade at the end of the bar is caused to cut material adjacent the groove bottom by gradually turning the grip at the bar end. In this way, a cut-out mass is taken out by leaving the outer eventual crucible material.

However, the bottom inner surface of the eventual crucible material obtained with the cutting tool, is not spherical, so that the inner peripheral wall surface and the bottom inner surface are not sommothly continuous but define a borderline between them. To make such bottom inner surface to be spherical, the cutting margin on the crucible bottom inner surface is increased.

SUMMARY OF THE INVENTION

The present invention seeks to obviate the above drawback, and has an object of providing a method, which permits fabrication of a graphite crucible having a spherical bottom inner surface form a cylindrical mass graphite material by using a novel cutting process carried out by using cutting means, which has one or more cutters provided on a spherical base.

To attain this object, the present invention features a method of manufacturing split crucible pieces of a multiple-piece graphite crucible comprising an integral assembly of two or more split crucible pieces and having a spherical bottom inner surface, the split crucible pieces being manufactured from a work mass graphite material by a mechanical process comprising:

a annular groove forming step of forming a blind annular groove coaxial with the work by cutting the work from an end thereof toward the other end;

a work splitting step of axially splitting the work having the annular groove into two or more pieces, constituting eventual split crucible pieces, having a sector-like or polygonal cross-sectional profile perpendicular to the axis of the work; and a bottom surface forming step of cutting each eventual split crucible piece form the side thereof opposite the sector-like or polygonal profile surface side until reaching the blind annular groove by using a spherical shape cutting means having a spherical base and one or more cutters provided on the outer periphery of the base, thereby forming each split crucible piece having a cylindrical inner surface and a spherical bottom inner surface.

PREFERRED MODE OF CARRYING OUT THE INVENTION

Figure 2:
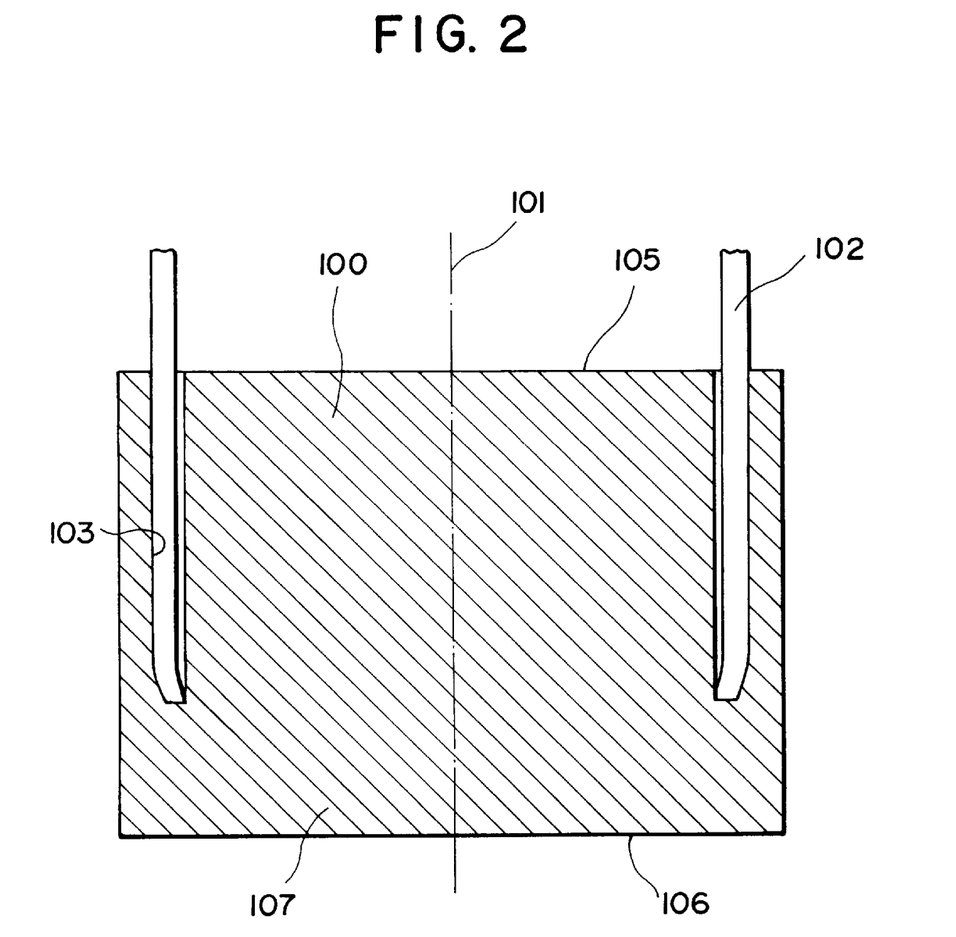
FIG. 2 is a sectional view illustrating a manner of forming an annular groove in a work mass graphite material for a graphite crucible by using a cutting tool.

Referring to FIG. 2, reference numeral 100 designates a work mass graphite material. The work 100 is usually held with its axis directed substantially horizontally or vertically. In this state, the work 100 has its outer periphery chucked with a chuck of a boring machine (not shown), and an annular groove 103 concentric with the axis 101 is formed in the work 100 with a rotating boring tool 102.

When the work mass graphite material 100 is used for the purpose of growing single crystal silicon by the CZ method, it comprises isotropic graphite which has constant physical and chemical characters, particularly thermal conductivity, in the direction of the axis 101 and directions perpendicular thereto, and rupture due to thermal stress based on thermal expansion coefficient difference is removed.

In the case of a graphite crucible for purpose other than the single crystal silicon growth by the CZ method, graphite material corresponding to the purpose may be selected.

The work mass graphite material 100 may be of any shape. Usually, the work 100 is cylindrical, but it may be polygonal or of any other shape in correspondence to the shape of the graphite crucible to be obtained.

The annular groove 103 is formed in the work mass graphite material 100 from one end 105 thereof toward the other end 106, but it does not reach the other end 106. That is, the annular groove 103 formed is blind, and its bottom 107 is at a distance from the other end 106 of the work 100. The bottom 107 constitutes the bottom inner surface of the product graphite crucible. That is, in the work mass graphite material 100, the bottom 107 of the annular groove 103 forms the bottom inner surface of the product graphite crucible, and the individual split crucible pieces constituting the graphite crucible are obtained by splitting the work 100 and then cutting resultant eventual split crucible pieces as will be described later.

Figure 3:
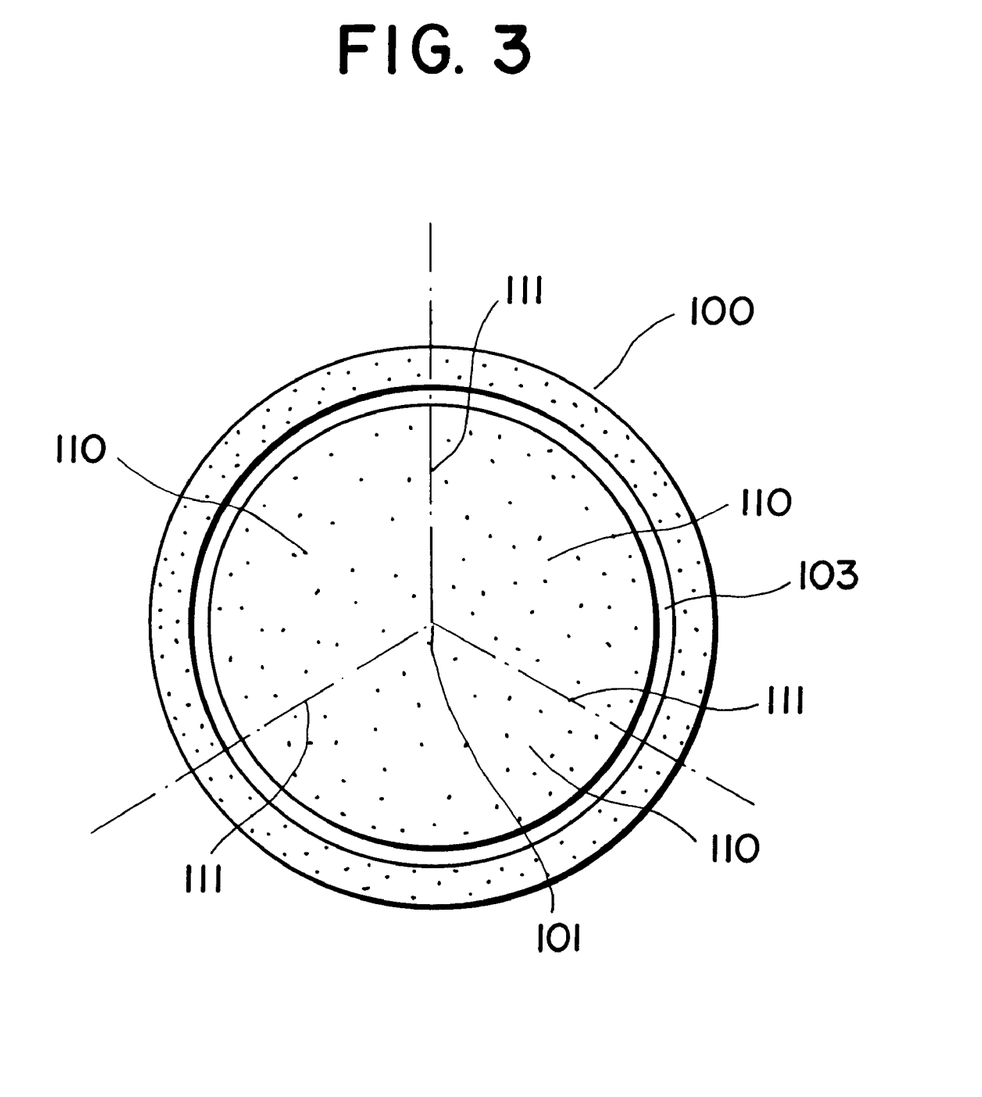
FIG. 3 is a sectional view illustrating a manner of splitting the work mass graphite material with the annular groove formed therein into eventual spit crucible pieces.

As shown in FIG. 3, the work mass graphite material 100 is subsequently split into two or more, particularly three or four, pieces as eventual split crucible pieces 110 for obtaining the split crucible pieces 130.

In the example shown in FIG. 3, the work mass graphite material 100 is split into three pieces. More specifically, the work is split in three splitting planes 111 as shown by the phantom lines. The individual splitting planes 111 include and extend from the axis 101 of the work 100. The work 100 may be split in this way into any desired number of pieces, such as three or four or five or more pieces.

As is seen from the cross-sectional view of FIG. 3, where the work mass graphite material is cylindrical, each eventual split crucible piece 110 obtained as a result of the splitting, has two splitting surfaces 111 intersecting each other in the axis 101 and a cylindrical or arcuate profile surface 112 between the two splitting surfaces 111.

Although not shown, in the case of a polygonal work mass graphite material, each eventual split crucible piece 110 has two splitting surfaces and part of the peripheral surface of the polygonal work mass graphite material.

Figure 4:
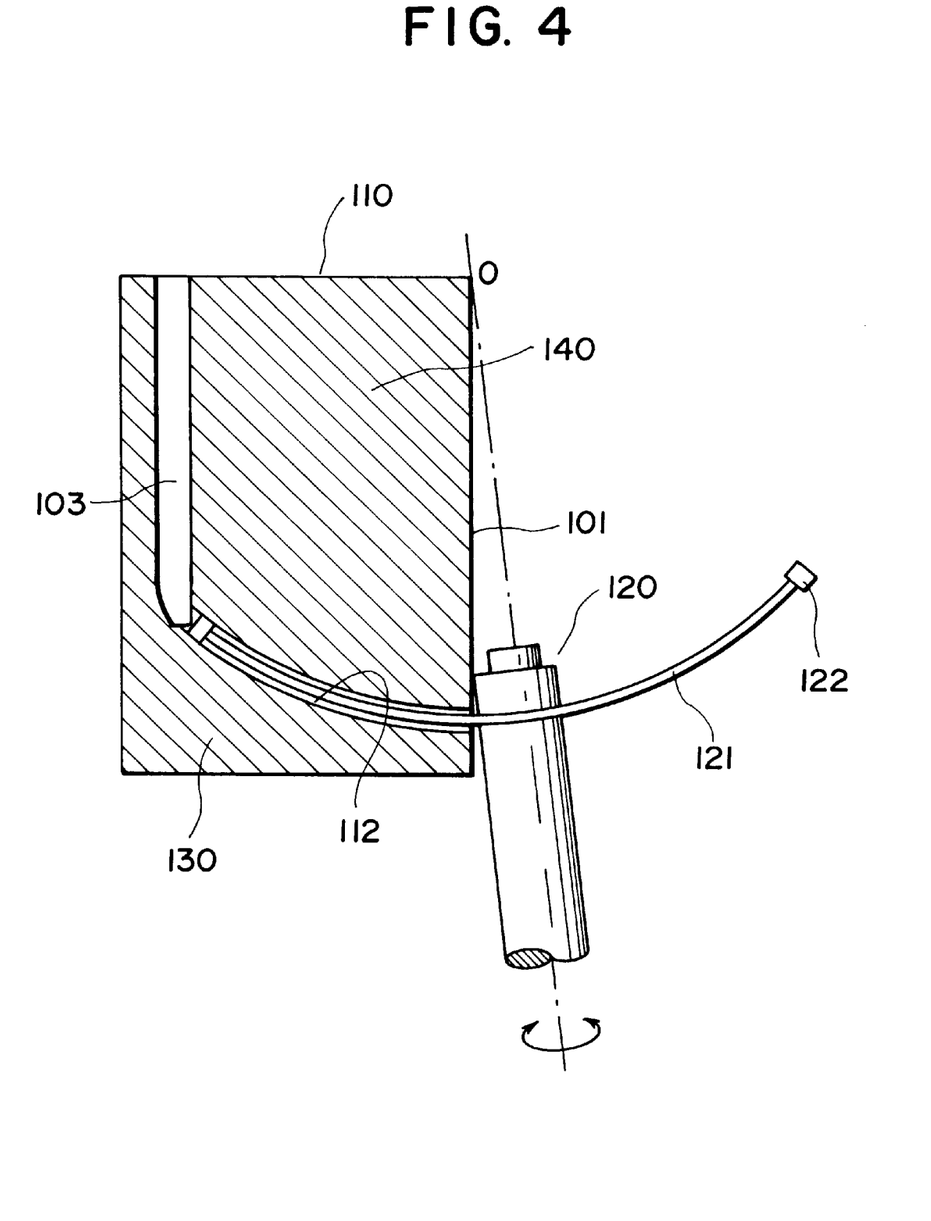
FIG. 4 is a view, partly in section, illustrating a manner of forming a split crucible piece by forming a spherical bottom inner surface in an eventual split crucible piece with a cutting means.

As shown in FIG. 4, the eventual split crucible piece 110 having the above shape is cut by advancing a spherical shape cutting means 120 thereinto from the side of the axis 103, in which the two splitting surfaces 111 intersect, until reaching of the bottom of the annular groove 103. As a result, the split crucible piece 130 is obtained, and also a mass of inner graphite material is obtained as a cut-out material 140.

Figure 5:
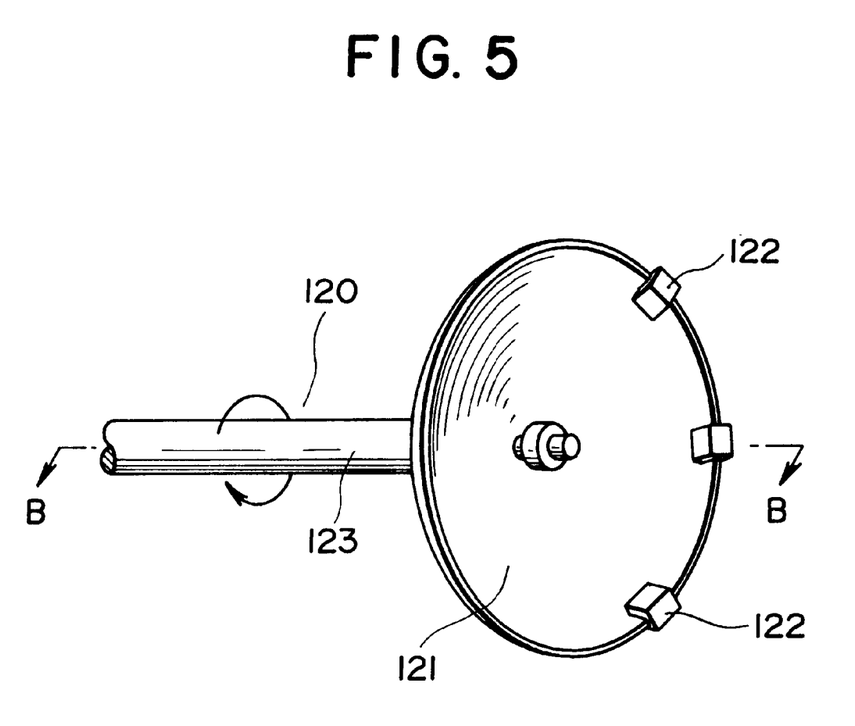
FIG. 5 is a perspective view showing a cutting means used in an embodiment of the present invention.
Figure 6:
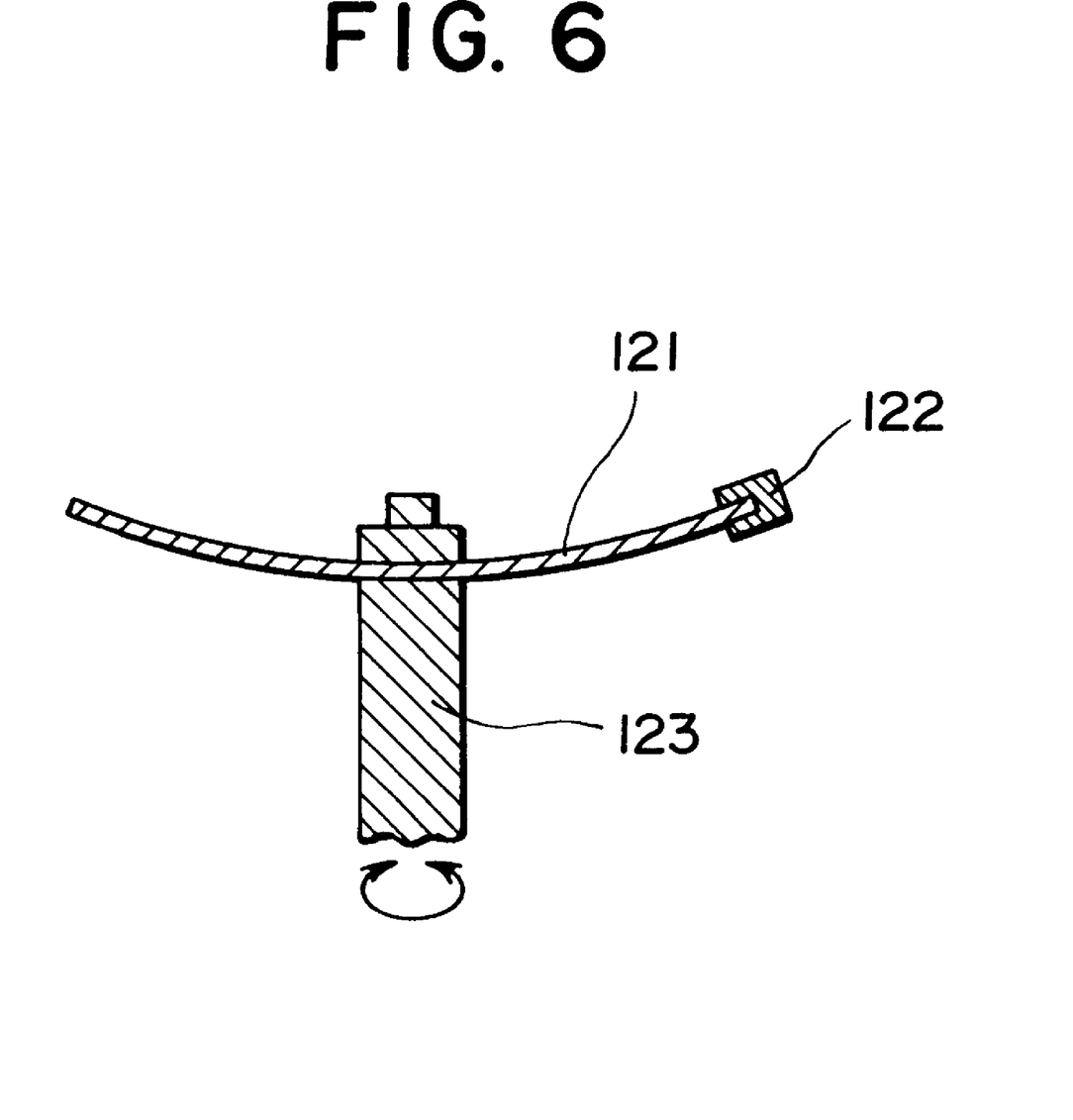
FIG. 6 is a sectional view taken along line B—B in FIG. 5.

FIG. 5 and 6 show an example of the spherical shape cutting means. FIG. 5 is a perspective view, and FIG. 6 is a sectional view taken along line B—B in FIG. 5.

The spherical shape cutting means 120 has a spherical base 121 and one or more cutting tools 122 provided on the outer periphery of the base 121. The spherical base 121 has a spherical or dish-like shape constituting part of a sphere, and it is made from a steel sheet or a stainless stell sheet.

The cutting tools 122 are provided at uniform internal on the outer periphery of the spherical base 121, but they need not be uniformly spaced apart. The cutting tools 122 are usually stellite tools or ceramic tools, but it is also possible to use high speed steel and the like as tool material.

As shown in FIG. 4, each eventual split crucible piece 110 is cut with a spherical shape cutting means 120 to from the side of the axis 101, in which the two splitting surfaces 111 intersect, until a cutting surface 112 reaches the bottom of the annular groove 103.

The graphite crucible used for the manufacture of single crystal silicon by the CZ method is usually obtained form a high density, high hardness graphite material. The graphite material which is such a high hardness graphite material requires a tool having high hardness at high temperature for its cuttiing, because it is exposed to high temperature during cutting due to heat generated at this time. For this reason, the cutting tool 122 is suitably of a material which has a Rockwell A hardness of 70 or above at a temperature of at least 700° C. The stellite tool is made of an alloy mainly composed of cobalt and has a Rockwell C hardness of 50 or above, so that it suitable for the cutting of graphite material. The ceramic tool is made of a ceramic material mainly composed of aluminum oxide and has high hardness at high temperature, so that it is also suitable like the stellite tool.

As further tools, a cutting tool of cast steel or the like is suitable for cutting such graphite material, and super-hard tools are suitable to this end.

Generally, it is necessary to provide only a single cutting tool 122 on the spherical base 121. Where two or more tools are provided, they are suitably uniformly spaced apart on the outer periphery of the spherical base 121. By providing two or more tools in this way, noise and vibrations generated during cutting can be minimized.

When forming the bottom inner surface of the split crucible piece 130 with such spherical shape cutting means 120, the spherical shape cutting means 120, particularly the cutting tool or tools 122 on the spherical base 121, is brought closer toward the annular groove bottom from the side of the axis 101, in which the splitting surfaces 111 of the eventual split crucible piece 11 intersect.

More specifically, the eventual split crucible piece 110 is set on a rotatable table and chucked with a chuck, and is revolved about the axis 101 in a range of −60° to +60° relative to the rotating spherical shape cutting means 12. Alternatively, the eventual split crucible piece 110 may be held stationary instead of being revolved, while causing revolution of the rotating cutting means 120 to cut the piece 110.

In this cutting operation, by setting the center of curvature of the bittim inner surface of the graphite crucible to be obtained and the center of curvature of the spherical base 121 of the spherical shape cutting means 120 on the axis 101, in which the two splitting surfaces 111 of the eventual split crucible piece 110 intersect, the cut surface 112 of the eventual split crucible piece 110 is formed as a copying surface of the spherical base 121 of the spherical shape cutting means 120. The cut surface 112 is thus spherical with the same radius of curvature as the radius of curvature of the bottom inner surface of the graphite crucible to be obtained. More specifically, the spherical base 121 of the spherical shape cutting means 120, has spherical surface with the same radius of curvature as the radius of curvature of the bottom inner surface of the graphite crucible to be obtained. The spherical shape of the spherical base 121 thus coincides in shape with the bottom inner surface of the graphite crucible to be obtained. Thus, by cutting the eventuual split crucible piece 110 with the spherical shape cutting means 120 to form a copying surface of the spherical base 121, the cutting surface 112 formed in the eventual split crucible piece 110, constitutes part of the bottom inner surface of the graphite to be obtained when the split crucible pieces obtained by the cutting are assembled together. The bottom inner surface of the graphite crucible is thus spherical and smoothly continuous to the inner peripheral source thereof.

Figure 7:
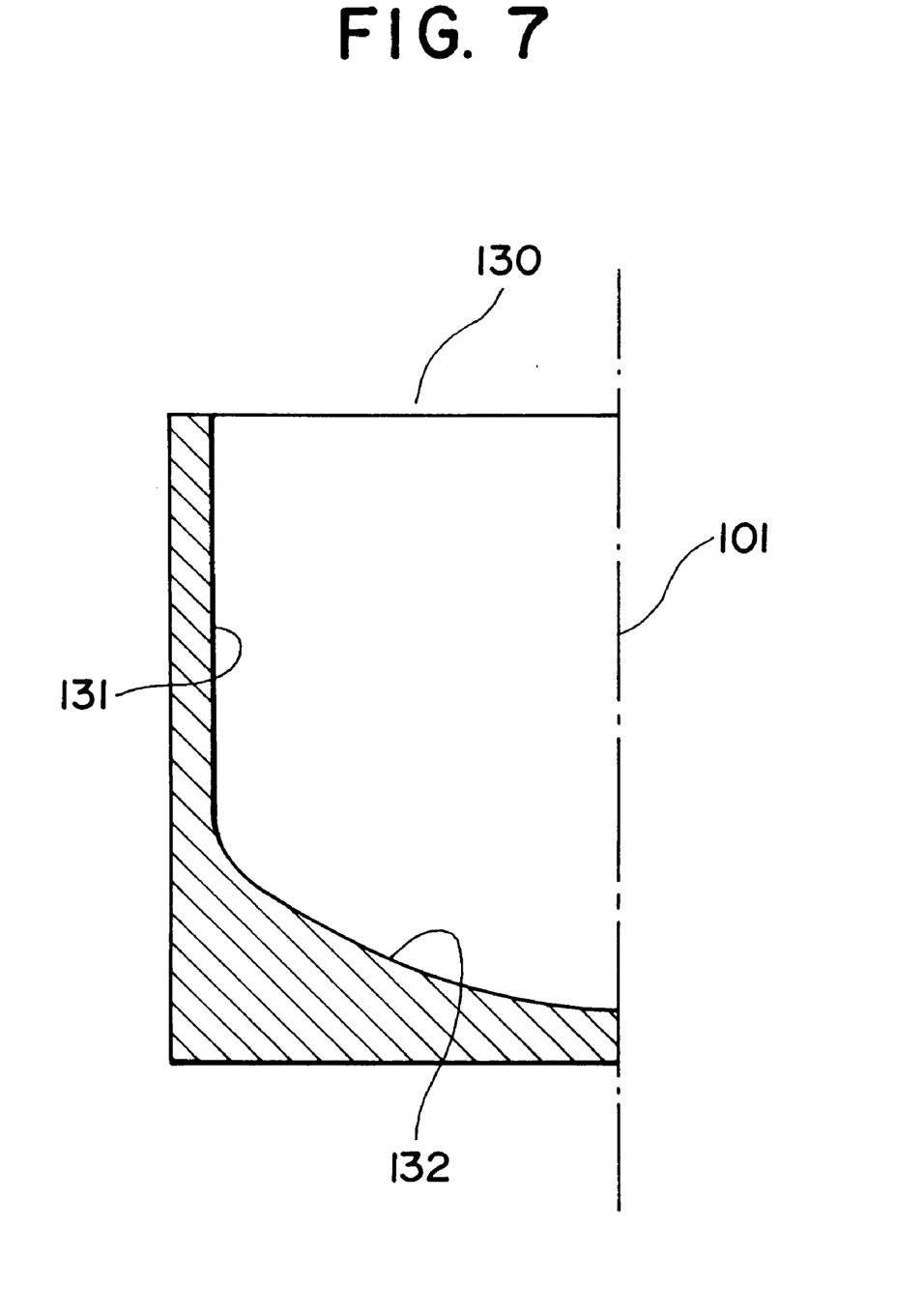
FIG. 7 is a sectional view showing a split crucible piece obtained by using the cutting means shown in FIGS. 5 and 6.

As a result of cutting of the eventual split graphite piece 110 with the spherical shape cutting means 120, the split crucible piece 130 is obtained, while a cut-out material 140 is obtained separately from the split crucible piece 130. As shown in FIG. 7, the split crucible piece 130 is such that its inner peripheral surface 131 is cylindrical and that its bottom inner surface 132 is sspherical.

When the eventual split crucible piece 110 is cut by copying the spherical base 121 of the spherical shape cutting means 120, the spherical shape or radius of curvature of the bottom inner surface 132 of the split crucible piece that is obtained is determined by the shape of the spherical base 121.

It is thus necessary to use, in correspondence to the shape or radius of curvature of the bottom inner surface of the graphite crucible to be obtained, a spherical shape cutting means having a spherical base with same shape or radius of curvature.

By selecting a cutting means having a spherical base, which corresponds to the spherical shape or radius of curvature of the bottom inner surface of the graphite crucible to be obtained, it is possible to obtain a graphite crucible bottom inner surface having the same spherical shape or radius of curvature as the spherical shape or radius of curvature of the spherical base. Such a bottom inner surface is smoothly continuous, without any borderline, to the inner peripheral wall surface of the graphite crucible, and can eliminate thermal stress concentration or the like.

As described before, in the prior art graphite crucible the bottom inner surface is finished to a spherical surface by machining in order to avoid stress concentration due to thermal stress when the crucible is exposed to a high temperature and thermal stress generation due to alternate repeating of cooling and heating. The machining of the bottom inner surface requires great man-hour. Particularly, very great deal of man-hour is required for finishing the surface to a spherical surface by various grinding and polishing operations. Such man-hour is reflected on the cost of the graphite crucible.

According to the present invention, the eventual split crucible piece is cut with a spherical shape cutting means to form a spherical bottom inner surface copied from the spherical base of the spherical shape cutting means. Thus, unlike the prior art, no mechanical processing such as grinding or polishing is needed to eliminate a borderline or discontinuity between the inner peripheral wall surface and the bottom inner surface.

In the prior art, another problem is encountered when splitting a mass graphite material into a plurality of eventual split crucible pieces and obtaining each split crucible piece by forming a spherical bottom inner surface in each eventual split crucible piece. That is, when the split crucible pieces are assembled together, the bottom inner surfaces thereof may fail to have the same radius of curvature.

According to the present invention, all the eventual split crucible pieces of a graphite crucible can be held as a group and cut with a spherical shape cutting means. When the cutting is does in this way, the bottom inner surfaces formed in the eventual split crucible pieces in the group all have the same radius of curvature as the radius of curvature of the spherical base of the spherical shape cutting means. By assembling together the split crucible pieces thus obtained, a graphite crucible thus can be obtained, which has a fixed radius of curvature.

In order that the individual split crucible pieces can be readily made integral when they are assembled together to obtain a commonly called multiple-piece graphite crucible, the back surface of bottom outer surface of each split crucible piece is processed as follows.

Figure 8:
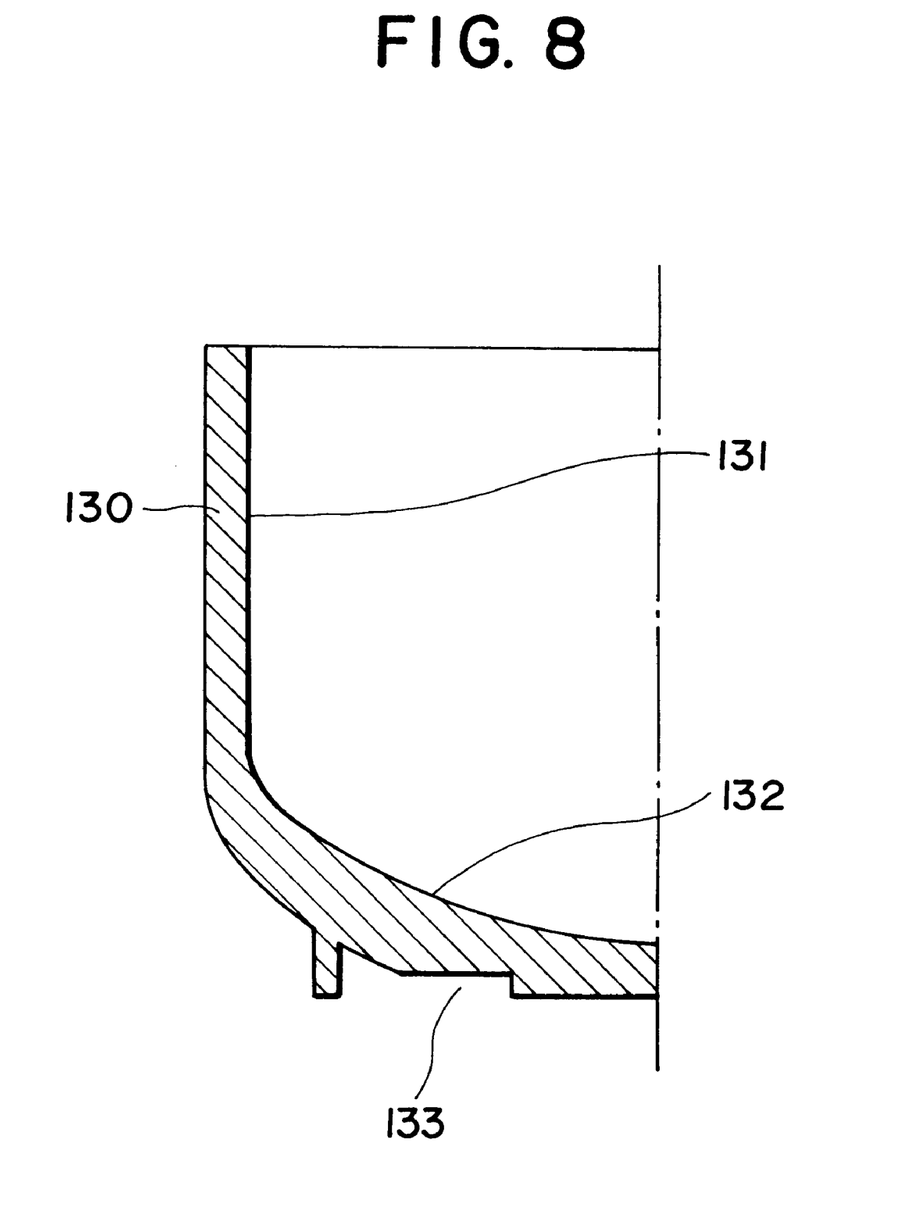
FIG. 8 is a sectional view showing a split crucible piece obtained by forming an engagement recess in the back surface of the split crucible piece shown in FIG. 7.

As shown in FIG. 8, in order to have the split crucible pieces 130 assembled together to be integral, the back surface of each split crucible piece 130 is formed with an engagement recess 133. The engagement recess 133 may have any shape, but it is suitably formed in a portion close to the peripheral wall.

The graphite crucible that is obtained by assembling together the split crucible pieces 130, has a spherical bottom inner surface. Thus, the thickness and hence the toward the peripheral wall 131. The mechanical strength of the graphite crucible thus is not spoiled by forming the engagement recess 133 in a bottom portion close to the peripheral wall 131.

As shown in FIG. 10, the engagement recess 133 is engaged by an engagement member 134. The engagement member 134 is made from a graphite material, and has portions complementary in shape to the engagement recess 133.

The engagement member 134 is usually disc-like, and has a central engagement recess 135, which is engaged by the upper end of the shaft such that the shaft is coaxial with the axis of the graphite crucible. As described before, the shaft is rotatable and vertically moveable. When raising the seed crystal of silicon, the shaft is vertically moved and also rotated, thus making the temperature of the melted silicon bath in the graphite crucible uniform to obtain a satisfactory single crystal silicon body.

The cut-out material that is obtained by cutting the eventual split crucible piece 110 with the spherical shape cutting means 120, substantially has a sector-like sectional profile having an arcuate portion defined between two lines intersecting at an end. That is, the cut-out material is a mass graphite material substantially similar in shape to the eventual split crucible piece 110 obtained by splitting the original mass graphite material. From such cut-out material a split crucible piece of a graphite crucible having a different size can be readily obtained by mechanically processing the material.

By assembling together and making integral the split crucible pieces 130, a graphite crucible having a sectional shape as shown in FIG. 9 can be obtained. FIG. 10 is a sectional view taken along line A—A in FIG. 10.

Particularly, the cut-out material can be directly used to manufacture a split crucible piece of a graphite crucible, which has a smaller size than the graphite crucible obtained form the original mass graphite material.

With an increasing size trend of wafers and the like, size trend. That is, larger graphite crucibles are finding increasing demands. To fabricate a large-size graphite crucible, a large-size mass graphite material is used. A cut-out material obtained form a large-size mass graphite material is considerably large in size, and can be directly utilized as an eventual split crucible piece of a graphite crucible.

Figure 11:
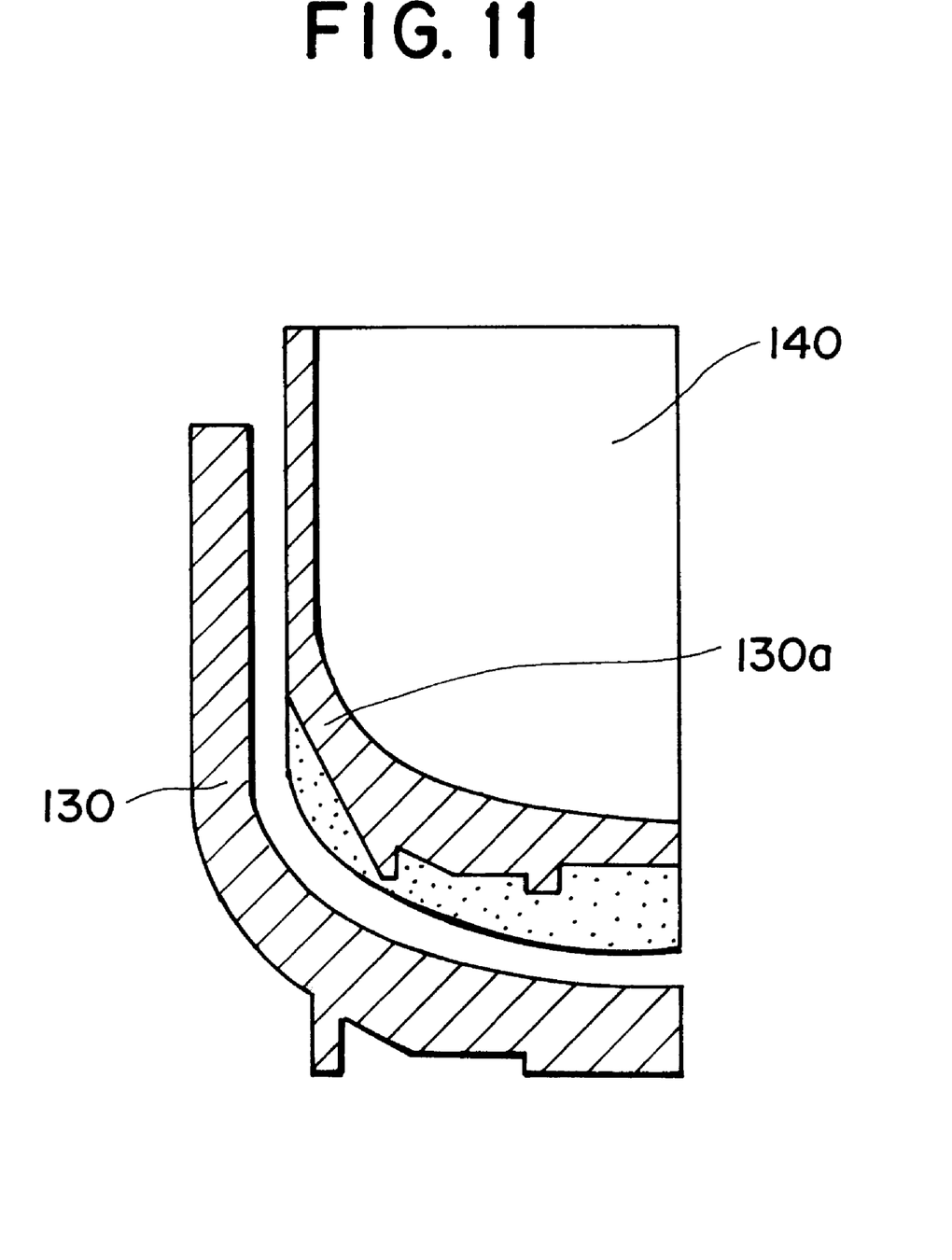
FIG. 11 is a view illustrating the relation of a split crucible piece and a smaller size split crucible piece obtained from a cut-out material taken out by cutting an eventual split cruciblepiece with the cutting means as shown in FIG. 4.

FIG. 11 shows a split crucible piece 130 obtained from an original mass graphite material and a split crucible piece 130a obtained form a cut-out material 140. The split crucible piece 130 which is contracted in size form the split crucible piece 130 obtained from the original mass graphite material, can be obtained by mechanically processing the cut out material 140.

Such mechanical processing can be carried out by forming an annular groove in the cut-out material 140, then forming a spherical bottom inner surface by using the spherical shape cutting means 120 and then forming an engagement recess in the back surface of the split crucible piece 130a thus obtained.

It is also possible to mechanically process the cut-out material 140, which already has a sector-like shape with a cylindrical surface and two splitting surfaces, without using the spherical surface cutting means. That is, the inner surface of the cut-out material 140 may be machined by holding the material in a cutting machine or the like, thus obtaining a split crucible piece having a different size.

As shown, the cut-out material 140 which is taken out as a mass from the original graphite material, is already an eventual split crucible piece, and thus can be utilized very effectively. Particularly, isotropic graphite which has a very high density and equal characters in either direction, takes a very long time, for instance one half to one year, for its manufacture. By stocking the cut-out material 140, it is possible to manufacture split crucible pieces when desired. This is very useful.

As has been described in the foregoing, according to the present invention a method of manufacturing split crucible pieces of a multiple-piece graphite crucible comprising an integral assembly of two or more split crucible pieces and having a spherical bottom inner surface the split crucible pieces being manufactured from a work mass graphite material by mechanical processing, is provided, which comprises an annular groove forming step of forming a blind annular groove coaxial with the work by cutting the work from an end thereof toward the other end, a work splitting step of axially splitting the work having the annular groove into two or more pieces, constituting eventual split crucible pieces, having a sector-like or polygonal cross-sectional profile perpendicular to the axis of the work, and a bottom surface forming step of cutting each eventual split crucible piece from the side thereof opposite the side of an arcuate or polygonal profile surface untill reaching of the blind annular groove by using a spherical shape cutting means having a spherical base and one or more cutting tools provided on the outer periphery of the base thereby forming each split crucible piece having a cylindrical inner surface and a spherical bottom inner surface.

Thus, by the method according to the present invention it is possible to directly form a spherical bottom inner surface of a graphite crucible and freely select the radius of curvature of the bottom inner surface by appropriately selecting the spherical shape cutting means to be used.

In addition, in manufacture the cut-out material can be recovered as mass graphite material, thus extremely reducing material loss in manufacture. For example, when manufacturing split crucible pieces of a graphite crucible having an inner diameter of 24 inches (60 cm) according to the present invention, it is possible having an outer diameter of 18 to 29 inches (45 to 50 cm) from the cut-out material.

Thus, the cost of the graphite crucible can be greatly reduced. In addition, it is not necessary to manufacture a mass graphite material in correspondence to the size of the graphite crucible to be obtained.

Instead, only large-size mass graphite material may be manufactured by mass production. It is thus also possible to reduce the stock of graphite material, which requires a long process of manufacture (of one half to one year).

What is claimed is:

1. A method of manufacturing split crucible pieces of a multiple-piece graphite crucible comprising an integral assembly of two or more split crucible pieces and having a spherical bottom inner surface, the split crucible pieces being manufactured from a work mass graphite material by mechanical processing, comprising:

forming a blind annular groove coaxial with the work by cutting the work from an end thereof toward the other end;

axially splitting the work having the annular groove into two or more pieces, constituting eventual split crucible sector pieces, each having a polygonal cross-section perpendicular to the axis of the work; and cutting each eventual split crucible sector piece from the side thereof opposite the outer surface of the sector piece until reaching the blind annular groove by using a spherical shape cutting means having a spherical base and one or more cutting tools provided on the outer periphery of the base, thereby forming each split crucible sector piece having a cylindrical inner surface and a spherical bottom inner surface.

2. The method of manufacturing split crucible pieces of a multiple-piece graphite crucible according to claim 1, wherein the multiple-piece graphite crucible is used for the manufacture of a silicon single crystal body by utilizing a vapor growth process.

3. The method of manufacturing split crucible pieces of a multiple-piece graphite crucible according to claim 1, wherein the work mass graphite material is an isotropic graphite material mass cylindrical in shape and having equal thermal conductivity at least in the axial direction and direction perpendicular thereto.

4. The method of manufacturing split crucible pieces of a multiple-piece graphite crucible according to claim 1, wherein in the work splitting step the work having the annular groove is split in its axial direction into three or four pieces.

5. The method of manufacturing split crucible pieces of a multiple-piece graphite crucible according to claim 1, wherein the spherical shape cutting means used in the bottom surface forming step, has a radius of curvature conforming to the radius of curvature of the spherical bottom inner surface of the multiple-piece graphite crucible to be manufactured.

6. The method of manufacturing split crucible pieces of a multiple-piece graphite crucible according to claim 1, wherein in the bottom surface forming step the center of curvature of the spherical base of the spherical shape cutting means is made to coincide with the center of curvature of the spherical bottom inner surface of the multiple-piece graphite crucible to be manufactured.

7. The method of manufacturing split crucible pieces of a multiple-piece graphite crucible according to claim 1, wherein the bottom surface forming step is carried out by causing rotation of the eventual split crucible sector piece about the intersection line between the two split surfaces of the eventual split crucible sector piece relative to the spherical shape cutting means.

8. The method of manufacturing split crucible pieces of a multiple-piece graphite crucible according to claim 1, wherein the bottom surface forming step is carried out by causing rotation of the spherical shape cutting means about the axis thereof relative to the eventual split crucible sector piece.

9. A method of manufacturing split crucible pieces of a multiple-piece graphite crucible according to either of claims 1, 5, 6, 7 or 8, wherein at least two uniformly spaced-apart cutting tools are provided on the outer periphery of the spherical base of the spherical shape cutting means used in the bottom surface forming step.

* * * * *